US011855196B2

(12) United States Patent
Cai et al.

(10) Patent No.: US 11,855,196 B2
(45) Date of Patent: Dec. 26, 2023

(54) TRANSISTOR WITH WRAP-AROUND EXTRINSIC BASE

(71) Applicant: GLOBALFOUNDRIES Singapore Pte. Ltd., Singapore (SG)

(72) Inventors: Xinshu Cai, Singapore (SG); Shyue Seng Tan, Singapore (SG); Vibhor Jain, Williston, VT (US); John J. Pekarik, Underhill, VT (US); Kien Seen Daniel Chong, Singapore (SG); Yung Fu Chong, Singapore (SG); Judson R. Holt, Ballston Lake, NY (US); Qizhi Liu, Lexington, MA (US); Kenneth J. Stein, Sandy Hook, CT (US)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 23 days.

(21) Appl. No.: 17/509,611

(22) Filed: Oct. 25, 2021

(65) Prior Publication Data
US 2023/0129914 A1 Apr. 27, 2023

(51) Int. Cl.
*H01L 29/737* (2006.01)
*H01L 29/66* (2006.01)
*H01L 29/45* (2006.01)
*H01L 29/10* (2006.01)

(52) U.S. Cl.
CPC ...... *H01L 29/7371* (2013.01); *H01L 29/1004* (2013.01); *H01L 29/45* (2013.01); *H01L 29/66242* (2013.01)

(58) Field of Classification Search
CPC . H01L 29/7371; H01L 29/1004; H01L 29/45; H01L 29/66242
See application file for complete search history.

(56) References Cited

U.S. PATENT DOCUMENTS

| 5,338,694 A | 8/1994 | Ilderem et al. |
| 6,767,797 B2 | 7/2004 | Krutsick |
| 6,806,554 B2 | 10/2004 | Hsu |
| 7,105,415 B2 | 9/2006 | Bock et al. |
| 8,536,012 B2 | 9/2013 | Camillo-Castillo et al. |
| 10,777,668 B2 | 9/2020 | Jain et al. |
| 2005/0104160 A1 | 5/2005 | Ahmed et al. |

(Continued)

OTHER PUBLICATIONS

Specification and drawings for U.S. Appl. No. 17/509,604, filed Oct. 25, 2021, 22 pages.

(Continued)

*Primary Examiner* — Syed I Gheyas
(74) *Attorney, Agent, or Firm* — Francois Pagette; Andrew M. Calderon; Calderon Safran & Cole P.C.

(57) ABSTRACT

The present disclosure relates to semiconductor structures and, more particularly, to transistor with wrap-around extrinsic base and methods of manufacture. The structure includes: a substrate; a collector region within the substrate; an emitter region over the substrate and which comprises silicon based material; an intrinsic base; and an extrinsic base overlapping the emitter region and the intrinsic base; an extrinsic base overlapping the emitter region and the intrinsic base; and an inverted "T" shaped spacer which separates the emitter region from the extrinsic base and the collector region from the emitter region.

20 Claims, 6 Drawing Sheets

(56) References Cited

U.S. PATENT DOCUMENTS

| | | |
|---|---|---|
| 2005/0121748 A1 | 6/2005 | Ahlgren et al. |
| 2005/0212087 A1 | 9/2005 | Akatsu et al. |
| 2007/0051980 A1 | 3/2007 | Hodge et al. |
| 2007/0238258 A1 | 10/2007 | Adam et al. |
| 2009/0108300 A1 | 4/2009 | Gluschenkov et al. |
| 2014/0151750 A1 | 6/2014 | Camillo-Castillo et al. |
| 2018/0226347 A1 | 8/2018 | Stamper et al. |
| 2020/0066885 A1* | 2/2020 | Jain ...................... H01L 29/732 |
| 2020/0357796 A1 | 11/2020 | Adusumilli et al. |

OTHER PUBLICATIONS

Office Action in U.S. Appl. No. 17/509,604 dated Mar. 10, 2023, 12 pages.
Response to Office Action in U.S. Appl. No. 17/509,604 dated May 30, 2023, 13 pages.
Final Office Action in U.S. Appl. No. 17/509,604 dated Jul. 20, 2023, 17 pages.
Response to Final Office Action in U.S. Appl. No. 17/509,604 dated Aug. 31, 2023, 9 pages.

* cited by examiner

TRANSISTOR WITH WRAP-AROUND EXTRINSIC BASE

FIELD OF THE INVENTION

The present disclosure relates to semiconductor structures and, more particularly, to a transistor with wrap-around extrinsic base and methods of manufacture.

BACKGROUND

A heterojunction bipolar transistor (HBT) is a type of bipolar junction transistor (BJT) which uses differing semiconductor materials for the emitter and base regions or collector and base regions, creating a heterojunction. HBTs are used in power amplifier and cellular applications, amongst others, and require low collector-base capacitance (Ccb), low base resistance (Rb), high cut-off frequencies (fT/fMAX) and high breakdown voltage (BVceo). However, current integration schemes for fabricating the HBT result in high Ccb (parasitic capacitance) and high Rb, which is a concern in bipolar technologies as it limits device scaling for improved fT/fMAX.

SUMMARY

In an aspect of the disclosure, a structure comprises: a substrate; a collector region within the substrate; an emitter region over the substrate and which comprises silicon based material; an intrinsic base; an extrinsic base overlapping the emitter region and the intrinsic base; and an inverted "T" shaped spacer which separates the emitter region from the extrinsic base and the collector region from the emitter region.

In an aspect of the disclosure, a structure comprises: a collector region within a substrate; a raised intrinsic base over the substrate; a polysilicon emitter over the raised intrinsic base; and an extrinsic base wrapping around and partially above the emitter and the raised intrinsic base.

In an aspect of the disclosure, a method comprises: forming a collector region within a substrate; forming an emitter region over the substrate and which comprises polysilicon material; forming an extrinsic base overlapping the emitter region; and forming an inverted "T" shaped spacer which separates the emitter region from the extrinsic base and the collector region from the emitter region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a transistor with wrap-around extrinsic base and methods of manufacture. More specifically, the transistor is a heterojunction bipolar transistor with an inverted "T" shaped spacer and wrap-around extrinsic base. Advantageously, the wrap-around extrinsic base overlaps the emitter and allows higher surface area for silicide and ohmic contact formation resulting in a lower $R_B$ (e.g., approximately 20% lower $R_B$) and higher $F_{MAX}$ (e.g., approximately 11.2% higher $F_{MAX}$) compared to conventional integration schemes.

In embodiments, the transistor is a heterojunction bipolar transistor with a wrap-around extrinsic base over an intrinsic base. The heterojunction bipolar transistor comprises an inverted "T" shaped spacer (e.g., reverse "T" shaped spacer) between the extrinsic base and the emitter. The wrap-around extrinsic base (and silicide) may be provided about the intrinsic base and emitter, in addition to partially above the emitter. In further embodiments, the wrap-around extrinsic base comprises epitaxially grown Si material and the emitter comprises polysilicon material. The silicide of the extrinsic base may also wrap-around the extrinsic base. The intrinsic base may be a raised intrinsic base comprising SiGe material and the extrinsic base may be a mono-crystalline doped Si based material. The extrinsic base may also be other semiconductor materials such as SiGe.

The transistor of the present disclosure can be manufactured in a number of ways using a number of different tools. In general, though, the methodologies and tools are used to form structures with dimensions in the micrometer and nanometer scale. The methodologies, i.e., technologies, employed to manufacture the transistor of the present disclosure have been adopted from integrated circuit (IC) technology. For example, the structures are built on wafers and are realized in films of material patterned by photolithographic processes on the top of a wafer. In particular, the fabrication of the transistor uses three basic building blocks: (i) deposition of thin films of material on a substrate, (ii) applying a patterned mask on top of the films by photolithographic imaging, and (iii) etching the films selectively to the mask.

Figure 1:
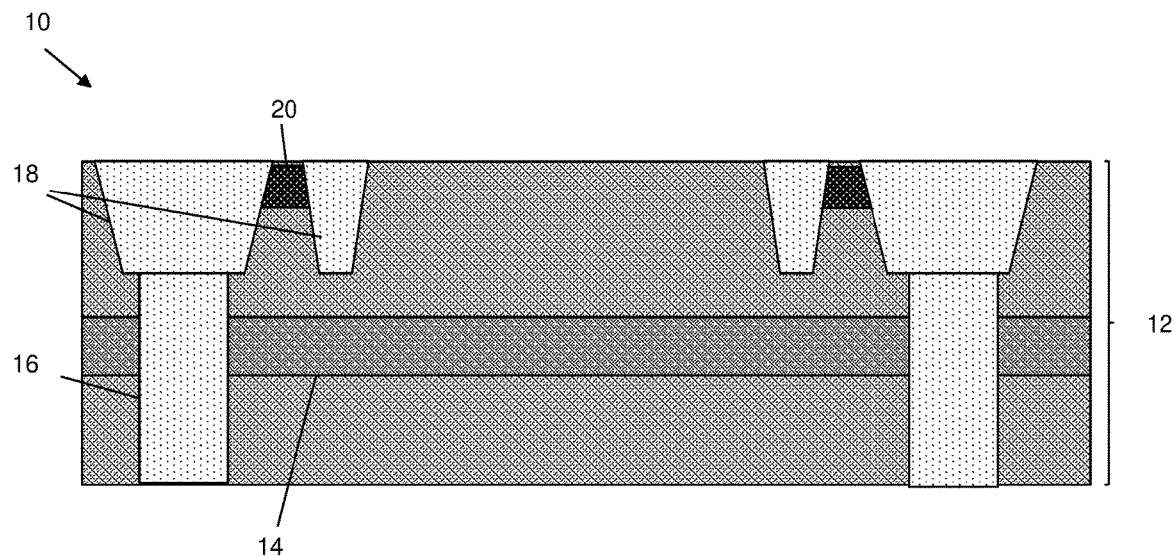
FIG. 1 shows a substrate with a collector region, amongst other features, and respective fabrication processes in accordance with aspects of the present disclosure.

FIG. 1 shows a substrate with a collector region, amongst other features, and respective fabrication processes. More particularly, the structure 10 of FIG. 1 includes a substrate 12 comprising semiconductor material. In embodiments, the substrate 12 may be a semiconductor-on-insulator (SOI) substrate or a bulk substrate composed of any suitable material including, but not limited to, Si, SiGe, SiGeC, SiC, GaAs, InAs, InP, and other III/V or II/VI compound semiconductors. The substrate 12 may be a single crystalline substrate of any suitable crystallographic orientation (e.g., a (100), (110), (111), or (001) crystallographic orientation).

Still referring to FIG. 1, a collector region 14 may be provided within the substrate 12. For example, the collector region 14 may buried within the substrate 12 (e.g., buried collector) and may comprise an N+ doped implant. In embodiments, the n-type dopants may be, e.g., Arsenic (As), Phosphorus (P) and Sb, among other suitable examples.

The collector region 14 may be formed by an ion implantation process that introduces a concentration of a dopant in the substrate 12. In the ion implantation process, for example, a patterned implantation mask may be used to define selected areas exposed for the implantations. The implantation mask may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions.

Deep trench isolation structures 16 and shallow trench isolation structures 18 may be formed in the substrate 12. The deep trench isolation structures 16 and the shallow trench isolation structures 18 may be formed in separate lithography, etching and deposition processes. For example, a resist formed over the substrate 12 is exposed to energy (light) to form a pattern (opening). An etching process with a selective chemistry, e.g., reactive ion etching (RIE), will be used to transfer the pattern from the photoresist to the substrate 12 to form one or more trenches within the substrate 12. Following the resist removal by a conventional oxygen ashing process or other known stripants, insulator material (e.g., oxide-based material) may be deposited within the trenches by any conventional deposition process, e.g., chemical vapor deposition (CVD) processes. Any residual insulator material on the surface of the substrate 12 can be removed by conventional chemical mechanical polishing (CMP) processes.

A plurality of wells 20 may be formed in the substrate 12, between the shallow trench isolation structures 18. In embodiments, the wells 20 may be formed by an ion implantation process as already described herein. The wells 20 may be N+ doped wells, as an example. The N-type dopant may be, e.g., AS, Ph, etc. The wells 20 may be used to connect the buried n+ well underneath, e.g., collector region 14.

Figure 2:
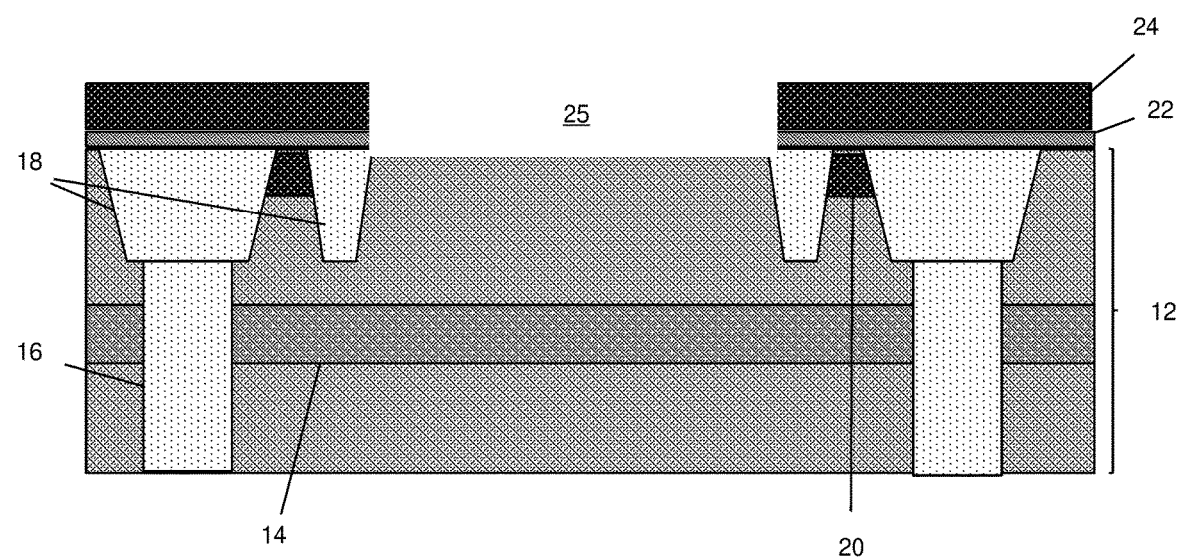
FIG. 2 shows a cap layer and hardmask on the substrate, amongst other features, and respective fabrication processes in accordance with aspects of the present disclosure.

In FIG. 2, a cap layer 22 and hardmask 24 may be formed on the substrate 12. In embodiments, the cap layer 22 may be SiO$_2$ and the hardmask 24 may be SiN, both of which are blanket deposited using any conventional deposition method such as CVD. An opening 25 is formed through the cap layer 22 and hardmask 24 to expose the underlying substrate 12. In embodiments, the opening 24 is between the shallow trench isolation structures 18. The opening 25 may be formed by conventional lithography and etching processes as already described herein such that no further explanation is required for a complete understanding of the present disclosure.

Figure 3:
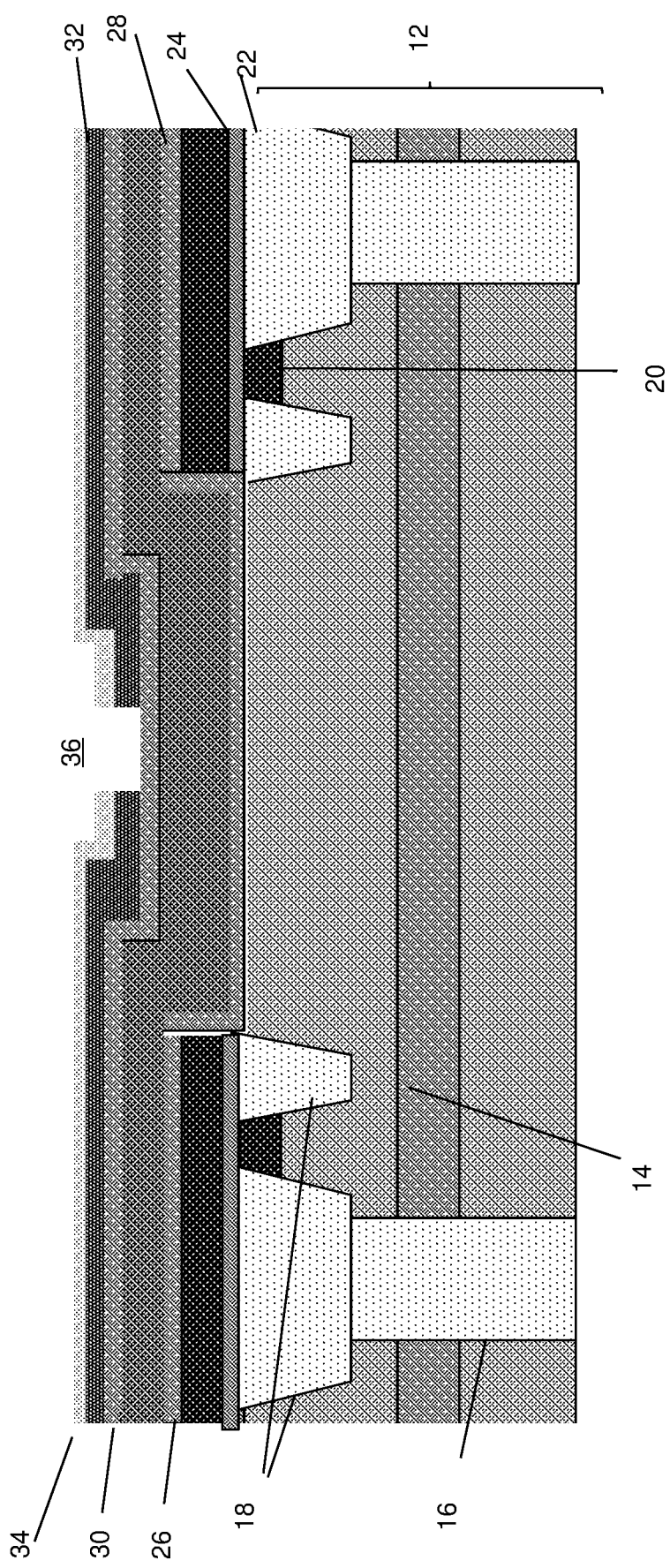
FIG. 3 shows a plurality of semiconductor materials and hardmask materials within an opening of the hardmask, amongst other features, and respective fabrication processes in accordance with aspects of the present disclosure.

FIG. 3 shows a plurality of semiconductor materials 26, 28, 30 and hardmask materials 32, 34, all of which are formed over the hardmask 24 and within the opening 25. In embodiments, the plurality of semiconductor materials 26, 28, 30 may be formed by either selective or non-selective epitaxial growth processes. The semiconductor materials 26, 30 may be undoped Si material and the semiconductor material 28 may be SiGe material. The SiGe material 28 may be used to form a raised SiGe intrinsic base. The semiconductor material 26 may act as an intrinsic emitter region and the semiconductor material 30 may act as an intrinsic collector region. The hardmask materials 32, 34 may be, for example, SiO$_2$ and SiN, respectively, formed by a conventional deposition process, e.g., CVD. The hardmask materials 32, 34 may be patterned to form an emitter opening 36.

Figure 4:
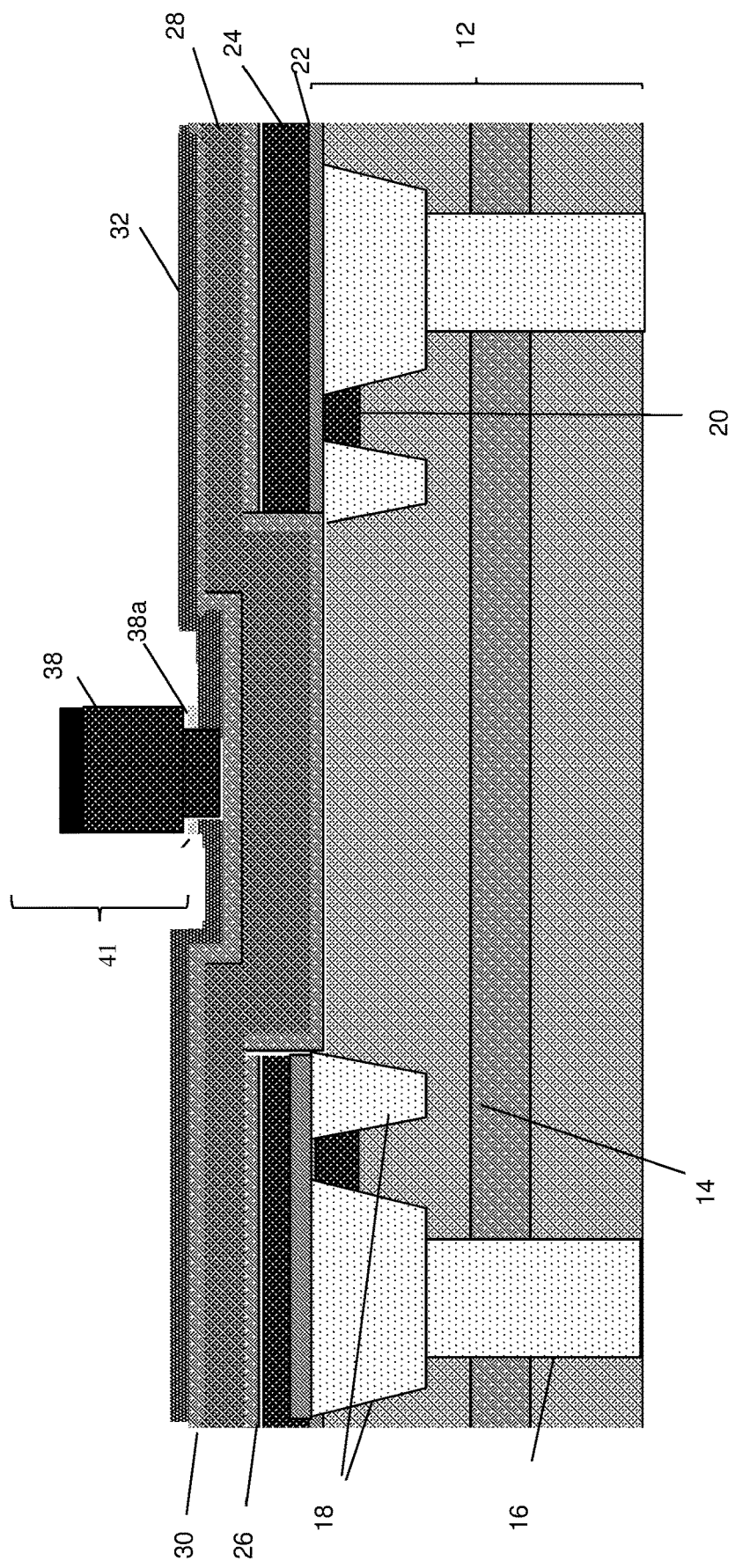
FIG. 4 shows a polysilicon emitter material, amongst other features, and respective fabrication processes in accordance with aspects of the present disclosure.

As further shown in FIG. 4, a silicon material 38 may be formed within the opening 36 and over the hardmask material 34. The silicon material 38 may be a monocrystalline silicon or a polysilicon. A cap material 40 may be formed over the silicon material 38. The silicon material 38 may be formed by an epitaxial growth process; whereas the cap material 40 may formed by a blanket deposition process known to those of skill in the art. The silicon material 38 and the cap material 40 may be patterned to form an emitter region as designated at reference numeral 41, which is patterned to slightly overhang the materials 32, 34. Any exposed materials 32, 34 may also be removed, exposing the semiconductor material 30. In embodiments, a portion of the materials 32, 34 will remain under the overhang 38a of the polysilicon emitter material 38 (and will form part of the inverted "T" shaped spacer).

Figure 5:
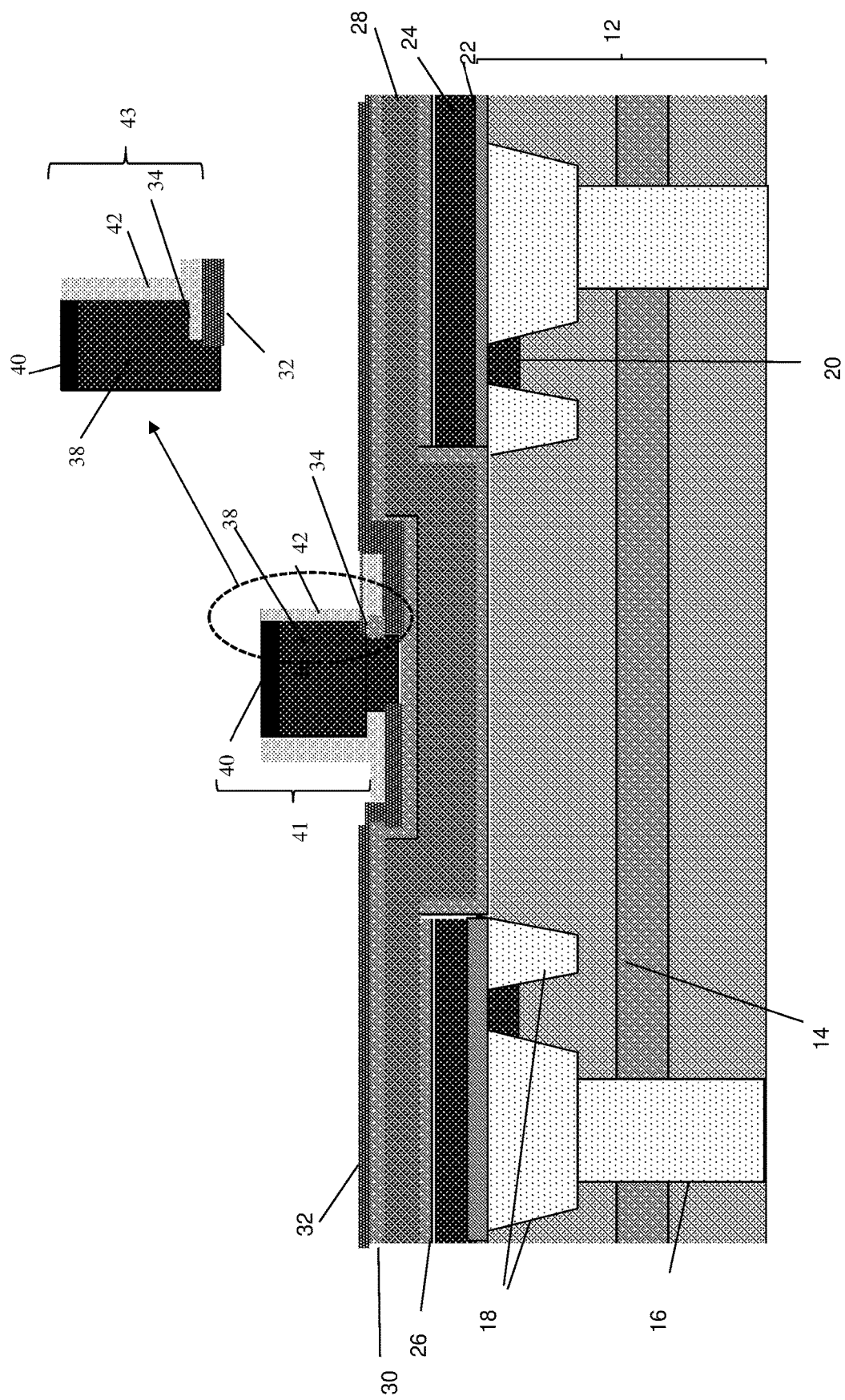
FIG. 5 shows an inverted "T" shaped spacer surrounding the emitter material, amongst other features, and respective fabrication processes in accordance with aspects of the present disclosure.

In FIG. 5, a sidewall spacer material 42 is formed on sidewalls of the emitter region 41, i.e., patterned material 38 and cap layer 40. The cap layer 40 may be a SiN layer. In embodiments, the sidewall spacer material 42 may be SiN material which contacts the materials 32, 34 (e.g., insulator materials). By an anisotropic etching process, the sidewall spacer material 42 may be removed from horizontal surfaces of the structure, resulting in an inverted "T" shaped spacer as shown in the exploded view of FIG. 5 at reference numeral 43. The inverted "T" shaped spacer (e.g., reverse "T" shaped spacer) 43 may surround the emitter region 41 and be between the extrinsic base (shown in FIGS. 7-9) and the emitter region 41.

Figure 6:
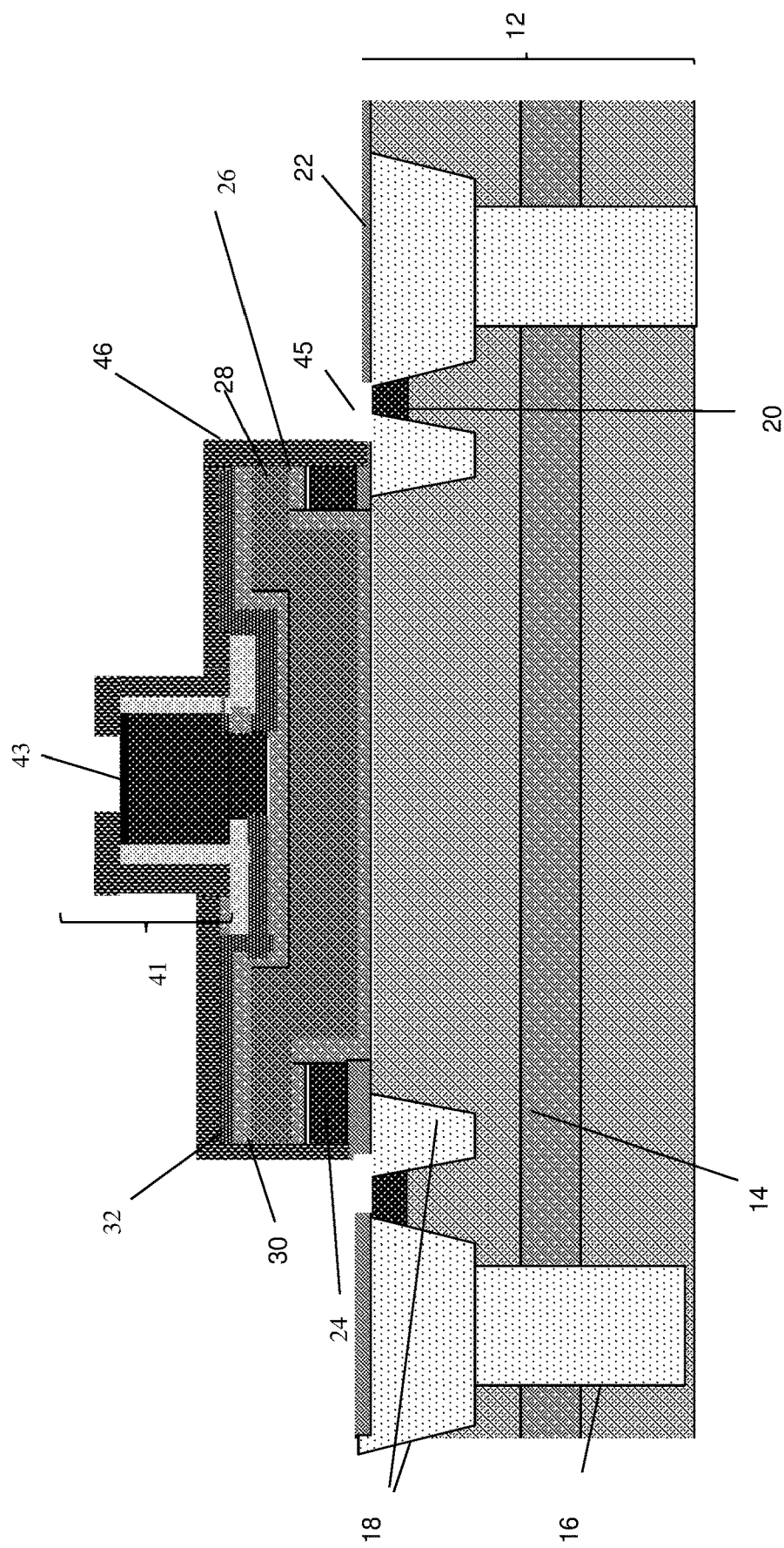
FIG. 6 shows an extrinsic base overlapping the emitter material, amongst other features, and respective fabrication processes in accordance with aspects of the present disclosure.

In FIG. 6, the materials 24, 26, 28, 30, 32 are patterned by conventional etching processes, e.g., RIE. For example, the SiGe material 28 is patterned into a SiGe intrinsic base (e.g., single crystalline semiconductor material). The cap layer 22 may also be patterned to form an opening 45 exposing a top surface of the wells 20. An epitaxial semiconductor material 46 may be provided on the exposed materials, e.g., patterned materials 24, 26, 28, 30, 32 and cap material 22, 40. The epitaxial semiconductor material 46 may be a P+ doped semiconductor material such as Si material or SiGe material over the undoped Si material 30. In embodiments, the epitaxial semiconductor material 46 may be provided by a non-selective growth process as should be understood by those of skill in the art.

In accordance with aspects described herein, the epitaxial semiconductor material 46 surrounds the emitter region 41, e.g., emitter material 38. Moreover, the epitaxial semiconductor material 46 may be Si material or SiGe material. The epitaxial semiconductor material 46 may be separated from the emitter polysilicon material 38 by the "T" shaped spacer (e.g., reverse "T" shaped spacer) 43.

Still referring to FIG. 6, the epitaxial semiconductor material 46 may be patterned to form the extrinsic base. The epitaxial semiconductor material 46 also is patterned to form an opening over the cap layer 40. The epitaxial semiconductor material 46 overlap with the emitter 41 with the layer 40 in between, with the layer 40 acting as the isolation layer between the epitaxial semiconductor material 46 and the emitter 38 (e.g., polysilicon emitter). In addition, the epitaxial semiconductor material 46 (e.g., extrinsic base) will surround, overlap or wrap-around the intrinsic base material, e.g., semiconductor material 26, and intrinsic collector material, e.g., semiconductor material 30. The patterning of the epitaxial semiconductor material 46 will also expose the wells 20 through the opening 45.

Figure 7:
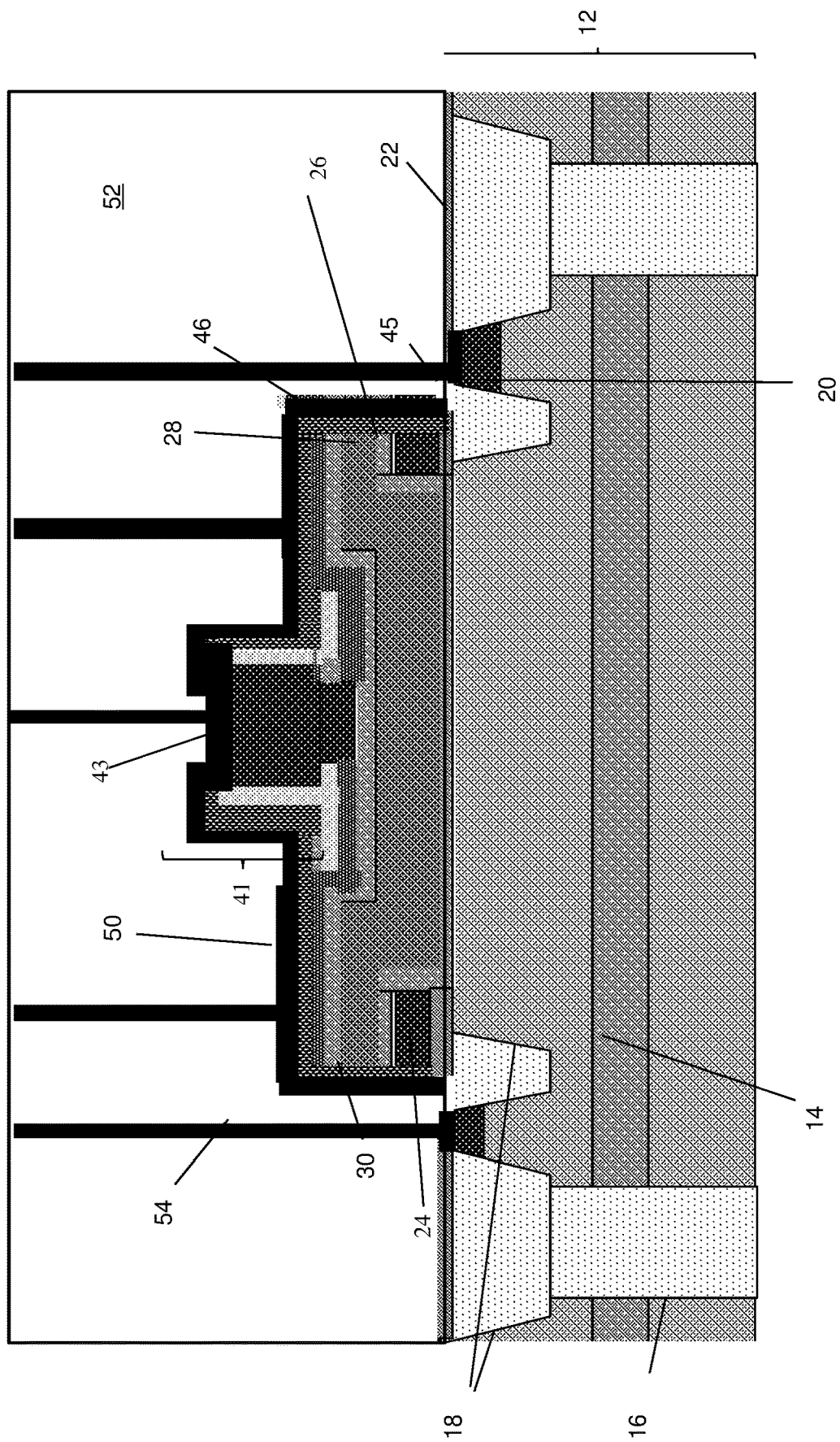
FIG. 7 shows a silicide on the extrinsic base and contacts to the silicide, amongst other features, and respective fabrication processes in accordance with aspects of the present disclosure.

As further shown in FIG. 7, a silicide 50 may be formed on the semiconductor material 46 (e.g., extrinsic base). In addition, the silicide 50 also surrounds or wraps around the semiconductor material 46 (e.g., extrinsic base), the intrinsic base material, e.g., semiconductor material 26, and intrinsic collector material, e.g., semiconductor material 30.

As should be understood by those of skill in the art, the silicide process begins with deposition of a thin transition metal layer, e.g., nickel, cobalt or titanium, over the semiconductor material 46, polysilicon emitter region 41 and wells 20. After deposition of the material, the structure is heated allowing the transition metal to react with exposed silicon (or other semiconductor material as described herein) forming a low-resistance transition metal silicide. Following the reaction, any remaining transition metal is removed by chemical etching, leaving silicide contacts 50 in the active regions of the device, e.g., wells 20, emitter region 41 and extrinsic base 46.

FIG. 7 further shows interconnects or contacts 54 which contact to the silicide 50 and more particularly the wells 20, emitter region 41 and extrinsic base 46. To form the contacts 54, an interlevel dielectric material or stack of interlevel dielectric materials 52 (e.g., SiN and SiO$_2$) over the structure. The interlevel dielectric material or stack of interlevel dielectric materials 52 may be deposited by a conventional deposition process, e.g., CVD. The interlevel dielectric material or stack of interlevel dielectric materials 52 will undergo lithography and etching processes, followed by deposition of a conductive material (e.g., contacts) within trenches formed in the interlevel dielectric material or stack of interlevel dielectric materials 52. The conductive material may be, for example, aluminum or tungsten, amongst other examples. Any excessive material on the interlevel dielectric material or stack of interlevel dielectric materials 52 may be removed by a conventional chemical mechanical planarization (CMP) process.

The transistor can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections and buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a substrate;
   a collector region within the substrate;
   an emitter region over the substrate and which comprises silicon based material;
   an intrinsic base;
   an extrinsic base overlapping the emitter region and the intrinsic base; and
   an inverted "T" shaped spacer comprising insulator material which separates the emitter region from the extrinsic base.

2. The structure of claim 1, further comprising a silicide on the extrinsic base which wraps around the emitter region.

3. The structure of claim 2, wherein the intrinsic base comprises a raised intrinsic base region, and the silicide and the extrinsic base wrap around the raised intrinsic base region and the emitter region.

4. The structure of claim 1, wherein the extrinsic base comprises polysilicon material.

5. The structure of claim 1, wherein the extrinsic base comprises mono-crystalline silicon material.

6. The structure of claim 1, wherein the inverted "T" shaped spacer partially extends under a portion of the emitter region and includes vertical sidewalls extending upwardly onto sidewalls of the emitter region.

7. The structure of claim 6, wherein the portion of the inverted "T" shaped spacer that partially extends under the portion of the emitter region comprises two different insulator materials and the extrinsic base extends upwardly over the vertical sidewalls of the inverted "T" shaped spacer and onto a top of the emitter region.

8. The structure of claim 1, wherein the extrinsic base is partially on top of the emitter region.

9. The structure of claim 8, wherein the extrinsic base and silicide on the extrinsic base comprise an opening on the top of the emitter region.

10. The structure of claim 1, wherein the intrinsic base is a raised intrinsic base comprising semiconductor material and further comprising an intrinsic collector region below the extrinsic base, wherein the inverted "T" shaped spacer separates the intrinsic collector region from the emitter region.

11. A structure comprising:
    a collector region within a substrate;
    a raised intrinsic base over the substrate;
    an emitter over the raised intrinsic base;
    an extrinsic base wrapping around and partially above the emitter and the raised intrinsic base; and
    a silicide on the extrinsic base which wraps around the emitter region.

12. The structure of claim 11, wherein the emitter comprises a silicon based material.

13. The structure of claim 12, wherein the raised intrinsic base comprises single crystalline semiconductor material.

14. The structure of claim 13, wherein the single crystalline semiconductor material comprises SiGe material.

15. The structure of claim 13, further comprising a spacer separating the emitter from the extrinsic base and the extrinsic base extends vertically upward over the spacer to a top surface of the emitter.

16. The structure of claim 15, wherein the spacer is an inverted "T" shaped spacer partially under the emitter.

17. The structure of claim 12, further comprising the silicide over the extrinsic base.

18. The structure of claim 17, wherein the extrinsic base surrounds sides and partially a top surface of the emitter with an opening for a contact.

19. The structure of claim 12, wherein the emitter comprises polysilicon material and further comprising an intrinsic collector region below the extrinsic base, and an inverted "T" shaped spacer which separates the intrinsic collector region from the emitter region.

20. A method comprising:
    forming a collector region within a substrate;
    forming an emitter region over the substrate and which comprises polysilicon material;
    forming an intrinsic base;
    forming an extrinsic base overlapping the emitter and the intrinsic base; and
    forming an inverted "T" shaped spacer comprising insulator material which separates the emitter region from the extrinsic base.

* * * * *